United States Patent [19]

Su

[11] Patent Number: 5,288,679
[45] Date of Patent: Feb. 22, 1994

[54] PROCESS FOR PRODUCING SUPERCONDUCTING WIRES

[75] Inventor: Sophia R. Su, Weston, Mass.

[73] Assignee: GTE Laboratories Incorporated, Waltham, Mass.

[21] Appl. No.: 797,874

[22] Filed: Nov. 26, 1991

Related U.S. Application Data

[63] Continuation-in-part of Ser. No. 745,819, Aug. 16, 1991.

[51] Int. Cl.$^5$ .............................................. H01L 39/12
[52] U.S. Cl. ........................................ 505/1; 505/740; 505/742; 264/57; 264/63; 264/65; 264/66; 264/82; 264/235; 264/332
[58] Field of Search ....................... 505/1, 739, 740; 264/63, 65, 66, 332, 57, 82, 235

[56] References Cited

U.S. PATENT DOCUMENTS

| | | | |
|---|---|---|---|
| 4,424,179 | 1/1984 | Minjolle et al. | 264/63 |
| 4,990,493 | 2/1991 | Lay | 505/1 |
| 5,011,823 | 4/1991 | Jin | 505/1 |
| 5,089,468 | 2/1992 | Yoshida et al. | 505/1 |

OTHER PUBLICATIONS

European Patent Application 0292126 published Nov. 23, 1988.
S. R. Su et al., "Novel Method of Synthesis for the 110 Phase of $(BiPb)_2Sr_2Ca_2Cu_3O_{10}$ Materials in the Form of Wires and Thick Films," Presented at NATO Advanced Study Institute-Physics and Materials Science of HTS (Abstract published in Proceedings-Physics and Materials of High $T_c$ Superconductors) Halkidiki, Greece (Aug. 18-31, 1991).
A. J. Bruce et al., *Mat. Res. Bull.* 23, pp. 349-355 (1988).
T. Aselage et al., *J. Mater. Res.* 3 [6] pp. 1279-1291 (Nov./Dec. 1988).
S. R. Su et al., *Physica C* 178 (1991) 81-88.
S. Su et al., "Microstructural Effects on Superconducting Properties of Sintered $YBa_2Cu_3O_{7-x}$", submitted to *J. Mat. Res.* Nov.-Dec. 1990.

*Primary Examiner*—Jan H. Silbaugh
*Assistant Examiner*—Christopher A. Fiorilla
*Attorney, Agent, or Firm*—Lawrence E. Monks

[57] ABSTRACT

A superconducting copper oxide based wire exhibiting improved critical current density and method. A superconductor powder and a binder melt are mixed at a solids loading of at least 90% by weight. The binder is an ester wax with no more than about 0.25 weight percent extrusion-aiding additives. The ester wax has the general formula RCOOR' with R and R' being hydrocarbon chains of at least 6 carbons. The ester wax melting point is 40°-100° C.; its melt viscosity is 94-2000 centipoise. The mixture is shaped and heated in an oxidizing atmosphere at up to 120° C./hr to 500°-600° C., and held at that temperature for a time sufficient to remove the binder and achieve a wire density of at least 50% of theoretical. The green wire is heated at 50°-130° C./hr to at least 920° C., and held at 920°-990° C. to achieve 90% of theoretical density, then annealed in oxygen. The wire may be textured during the heating process or by seeding. About 3-12 w/o silver may be included in a superconducting rare earth barium copper oxide based wire. The superconducting copper oxide based wire exhibits a density of at least about 99% of theoretical density, a critical temperature at dc zero resistance of at least about 90 K, and a critical current density of at least about 1000 A/cm$^2$.

9 Claims, 5 Drawing Sheets

PROCESS FOR PRODUCING SUPERCONDUCTING WIRES

CROSS REFERENCE TO RELATED APPLICATIONS

This application is a continuation-in-part of commonly owned, copending U.S. patent application Ser. No. 07/745,819 filed Aug. 16, 1991, by Sophia R. Su. Application 07/745,819 is incorporated herein by reference.

FIELD OF THE INVENTION

This invention relates to a method for producing high $T_c$ superconducting ceramic materials, and in particular to highly textured copper oxide based superconducting wires, tapes, and the like.

BACKGROUND OF THE INVENTION

Since the discovery of the high temperature superconductivity of $YBa_2Cu_3O_{7-x}$ material at about 95 K, worldwide efforts have centered on wire fabrication for applications in the areas of power generation, power transmission lines and passive microwave components such as helical resonators used in the telecommunication industry. However, these and related oxide superconductors are usually brittle and difficult to fabricate into useful shapes such as tapes, wires, or coils. Additionally, advanced processing techniques, e.g. melt texturing or zone melting, are required to texture the grains, i.e. align the grains along the anisotropic a-b conducting plane, to enhance critical current densities in the fabricated wires, etc.

As a consequence of the anisotropic nature of the superconductivity of such materials, their critical temperature, critical current density, and microwave properties have been found to be greatly influenced by their microstructures which, in turn, are largely determined by the fabrication process used. Practical wire applications for power generation will necessitate a critical density of the order of 100,000 $A/cm^2$ in magnetic fields up to 5 Tesla, whereas homogeneity of the bulk material and surface smoothness are critical to the material's application in microwave circuits. Therefore, novel materials processing methods are required to reduce defects, to enhance mechanical and electrical properties of the superconducting materials, and to enhance reproducibility.

In particular, the anisotropy and grain boundary effects have been identified as major contributors to low critical current density in, e.g., yttrium barium copper oxide superconducting materials. The granular structure results in small coherence length, causing the grain boundaries to act as Josephson junctions. The high degree of anisotropy suppresses tunneling currents at high-angle grain boundaries. These problems are exacerbated by residual porosity in the densified material.

Several processing techniques have been studied in attempts to improve these properties, including those based on cladding/swaging techniques borrowed from the metallurgical industry and others based on the fiber spinning and extrusion techniques used in the plastics industry. The cladding/swaging methods have shown promise, in some cases producing wires with high ductility and workability. However, the spinning and extrusion techniques have generally produced only brittle, inhomogeneous materials.

SUMMARY OF THE INVENTION

In accordance with one aspect of the invention, a method for producing a superconducting copper oxide based wire exhibiting improved critical current density involves mixing a copper oxide based superconductor as a powder and a binder as a melt at a solids loading of at least about 90% by weight to form a homogeneous extrudable powder/binder mixture. The binder consists essentially of an ester wax with no more than about 0.25 weight percent extrusion-aiding additives. The ester wax has the general formula RCOOR' with R and R' each being independently selected from the group consisting of long chain hydrocarbon groups of at least 6 carbons. The ester wax has a melting point of about 40°-100° C. and a viscosity of about 94-2000 centipoise at its melting point. The binder/powder mixture is shaped to form a shaped wire. The shaped wire is heated in an oxidizing atmosphere at a heating rate of up to about 120° C./hr to a binder removal temperature of about 500°-600° C., and the wire is held in the oxidizing atmosphere at the binder removal temperature for a time sufficient to remove the binder from the wire and to form a green wire having a density of at least 50% of theoretical density. The green wire is heated in the oxidizing atmosphere at a heating rate of about 50°-130° C./hr to a sintering temperature of at least about 920° C., and the wire is held in the oxidizing atmosphere at a temperature of about 920°-990° C. for a time sufficient to consolidate the green wire to a density of at least about 90% of theoretical density. The consolidated wire is cooled in the oxidizing atmosphere at a rate below about 130° C./hr to a cooled temperature at or below about 550° C. The cooled wire is held at an annealing temperature of about 450°-550° C. in an atmosphere of flowing oxygen for a time sufficient to convert the crystal structure of the wire to at least 50 v/o superconducting perovskite crystal.

In a narrower aspect of the invention, the wire may be textured during the heating process to produce grain alignment. In this aspect, the step of heating the green wire to the sintering temperature involves heating the green wire in the oxidizing atmosphere at a heating rate of about 50°-130° C./hr to about the incongruent melting temperature of the superconductor, and holding the green wire in the oxidizing atmosphere at the incongruent melting temperature for a time just sufficient to begin partial melting of at least one component in the superconductor. The partially melted wire is then cooled in the oxidizing atmosphere at a rate below about 130° C./hr to a consolidation temperature of about 920°-969° C., and held in the oxidizing atmosphere at the consolidation temperature for a time sufficient to consolidate the wire to a density of at least 90% of theoretical density and sufficient to acheive an average grain length of at least about 0.3 mm and grain alignment along the length of the wire.

In another narrower aspect of the invention, texturing may be produced in the wire by a method where the powder/binder mixture further includes at least about 3 w/o grain-aligned clusters of a like copper oxide based superconductor.

In another aspect of the invention, the method described above may be used to produce a superconducting rare earth barium copper oxide based wire including silver. The mixture includes a rare earth barium copper oxide based superconductor as a powder, silver or silver oxide as a powder in an amount of about 3-12 w/o of the total powder weight, and a binder as a melt at a solids loading of at least about 89% by weight.

In yet another aspect of the invention, a superconducting copper oxide based wire exhibits a density of at least about 99% of theoretical density, a critical temperature at dc zero resistance of at least about 90 K, and a critical current density of at least about 1000 A/cm$^2$.

In another, narrower aspect of the invention, the wire is a rare earth copper oxide superconductor and comprises silver as an intergranular phase in an amount of about 3–12 w/o. In yet another, narrower aspect of the invention, the wire is substantially grain-aligned.

BRIEF DESCRIPTION OF THE DRAWINGS

For a better understanding of the present invention, together with other objects, advantages and capabilities thereof, reference is made to the following description and appended claims, together with the drawings, in which:

DETAILED DESCRIPTION OF THE PREFERRED EMBODIMENTS

Figure 1:
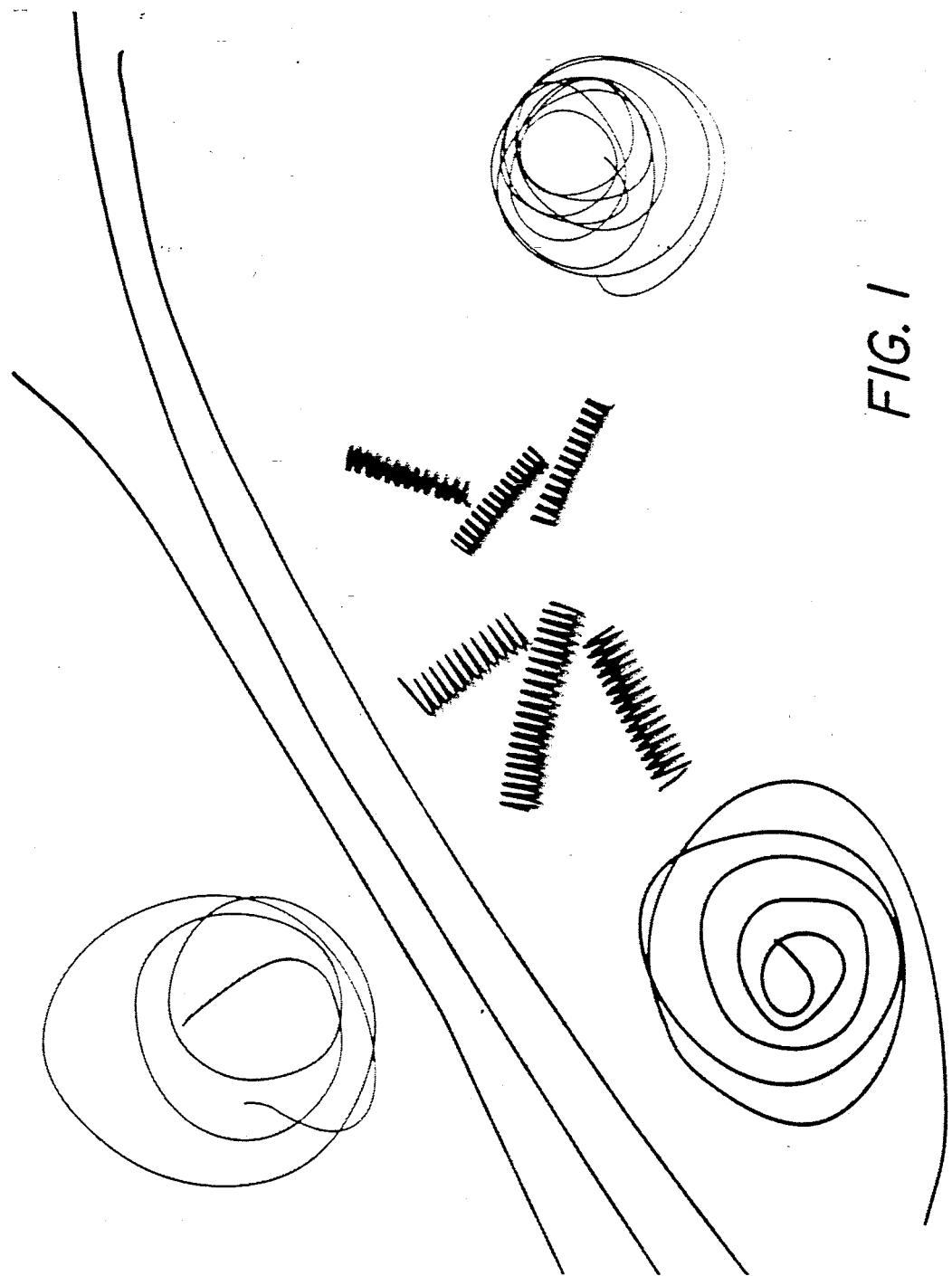
FIG. 1 is a photomicrograph of typical yttrium barium copper oxide wires and coils prepared in accordance with one embodiment of the invention.
Figure 2:
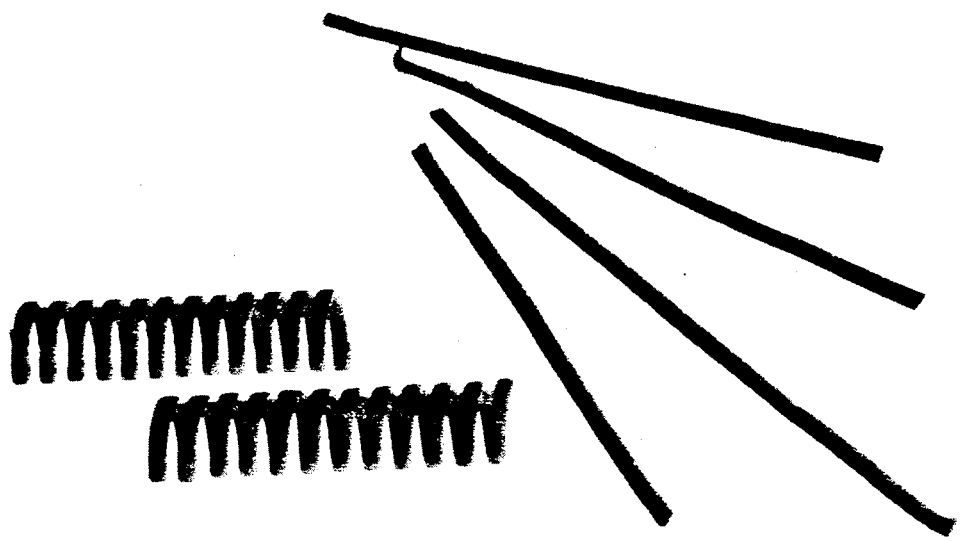
FIG. 2 is a photomicrograph of typical bismuth-lead strontium calcium copper oxide tapes and coils prepared in accordance with another embodiment of the invention.

The process described herein achieves a textured superconducting wire exhibiting a dense, homogeneous microstructure and a smooth surface. Thus, microstructural defects are reduced, and mechanical and electrical properties, particularly the critical current density, $J_c$, are enhanced. As used herein, the term "wire" is intended to include all elongated fibrous configurations, regardless of cross-sectional shape, of up to about 2 mm equivalent diameter and at least 5:1 aspect ratio (length to equivalent diameter), e.g. wires, tapes, fibers, and the like. The process is described particularly for wires formed from exemplary yttrium barium copper oxide and bismuth lead strontium calcium copper oxide superconducting materials, referred to herein as $YBa_2Cu_3O_{7-x}$ or Y—B—C—O and $(Bi,Pb)_2Sr_2CaCu_2O_x$ or $(Bi,Pb)_2Sr_2Ca_2Cu_3O_x$ or (Bi,Pb)—Sr—Ca—Cu—O respectively. However, the described process applies as well to any rare earth barium copper oxide, referred to herein as $(RE)Ba_2Cu_3O_{7-x}$ or RE—B—C—O, or any bismuth containing copper oxide material, with or without lead doping, which can be made similarly electrically conductive without resistance at temperatures above about 70 K. Exemplary wires, coils, and tapes of such materials are shown in FIGS. 1 and 2. FIG. 1 is a photomicrograph of typical $YBa_2Cu_3O_{7-x}$ wires and coils prepared in accordance with one aspect of the process described herein. FIG. 2 is a photomicrograph of typical $(Bi,Pb)_2Sr_2Ca_2Cu_3O_x$ tapes and coils prepared in accordance with another aspect of the process described herein.

The process involves mixing together the superconducting powder and the ester wax binder melt, then forming a continuous length of fiber or wire by plastic extrusion or drawing. The shaped wire is then heated to remove the binder, sintered to full density, and annealed. In a preferred process, the wire is textured to align the grains within the wire.

During the development of this novel process, it was determined that two factors were most important in controlling the microstructure of extruded wires of RE—B—C—O or bismuth containing copper oxide superconducting materials and consequent effects of this microstructure on superconducting properties. These factors are the binder system and the sintering conditions, i.e. temperature, heating rate, heating duration, and annealing. Described herein are: (1) a binder system which provides adequate rheological properties to RE—B—C—O powder or bismuth containing copper oxide powder (with or without lead doping) for shaping as high quality wires, etc. (as shown in FIGS. 1 and 2) by such methods as extrusion or drawing (melt-spinning); (2) an extrusion or drawing method suitable for shaping wires from these binder/powder mixtures; (3) a sintering schedule which can provide continuous processing from binder removal to densification and annealing; (4) two alternate methods of texturing the wires to enhance the critical current density, $J_c$; and (5) an alternate composition for superconducting RE—B—C—O wires containing silver or silver oxides.

As mentioned above, any rare earth barium copper oxide or bismuth containing copper oxide material which can be made electrically conductive without resistance at temperatures above about 70 K is suitable for the superconducting powder component of the powder/binder mixture. The term "RE" in the nominal formulas used herein is intended to include the rare earth elements, typically yttrium, lanthanum, neodymium, samarium, europium, gadolinium, dysprosium, holmium, erbium, ytterbium, and leutetium. Examples of such suitable powders are superconducting $YBa_2Cu_3O_{7-x}$ powders. Suitable bismuth containing copper oxide powders include those also containing strontium and calcium and, optionally, lead in a so-called 2212 or 2223 formulation (a 2:2:1:2 or 2:2:2:3 ratio of Bi:Sr:Ca:Cu or (Bi,Pb):Sr:Ca:Cu in the starting formulation). The 2223 formulation is the higher $T_c$ phase: $T_c = 110$ K.

Powders produced by any method are acceptable, as long as they meet the above-described criteria. For example, the following types of Y—B—C'O powders have been used successfully: (a) platelet-like $YBa_2Cu_3O_{7-x}$ powders synthesized in known manner under laboratory conditions by thermal decomposition of nitrate precursors followed by sintering in an oxidizing atmosphere; (b) jet milled solid state equiaxed $YBa_2Cu_3O_{7-x}$ powders commercially available from CPS Superconductor Corporation (Milford, Mass.); and (c) ball milled solid state equiaxed $YBa_2Cu_3O_{7-x}$ powders produced under laboratory conditions in known manner from mixtures of $Y_2O_3$, CuO, and $BaCO_3$. The morphological properties of the nitrate-precursor and solid state powders vary slightly due to the different shapes of the particles, platelet-like versus equiaxed; surface areas, 7.0 m²/g versus 3.3 m²/g; and methods of processing.

The superconducting powder is dispersed into a selected binder system which can provide adequate rheological properties, in terms of chemical compatibility and dispersibility, for the extruding or drawing step described herein. The rheological properties obtained with the binder system described in detail below include (a) a very high concentration of solids (powder) loading for high green density and (b) a high surface compatibility between powders and binder for deflocculation of the particles, uniform dispersibility, and homogeneous green microstructure.

It has been found that the green density of the binder-removed wire increases with increasing concentration of the powder in the binder (solids loading), and that this increased green density leads to a higher sintered density and improved critical current density in the wire product. For example, samples with a 91.5 w/o Y—B—C—O powder fraction yielded a green density of 70.7% of theoretical density, while a solids loading of 89.5 w/o yielded a density of only 64.0% of theoretical. Under identical 950° C. sintering conditions, these samples produced sintered densities of 94.0% and 88.0%, respectively. The binder system described herein permits maximum solids loading for increased green density, increased sintered density, and improved critical current density.

Binders suitable for the process described herein are ester waxes having melting points of about 40°-100° C., viscosities at the selected melting temperature of about 94-2000 centipoise, and the general formula RCOOR' with R and R' each being an aliphatic hydrocarbon chain of at least about 6 carbons. Preferred are binders which have no significant, i.e. below about 1 w/o (weight percent), residual carbonaceous material after burnout in an inert atmosphere such as nitrogen or argon. Also preferred are binders which exhibit a wide thermal decomposition range, e.g. at least 300° C., to avoid exothermic reactions which can cause cracking during the binder removal process. Examples of such suitable ester waxes are Ester Wax RT and Ester Wax E, manufactured by Hoechst Celanese. Ester Wax RT has a density of about 0.95-0.98 g/ml, decomposes at about 200°-550° C., and has aliphatic hydrocarbon terminal chains of at least 6 carbons; Ester Wax E has a density of about 1.01-1.03 g/ml, decomposes at about 250°-600° C., and also has aliphatic hydrocarbon terminal chains of at least 6 carbons. These ester waxes have melting points of about 77°-83° C., viscosity at the melting temperature of about 94 centipoise, and are completely removable from the shaped wire without significant residue by heating in air to moderate temperatures. Ester Wax RT leaves a residue of about 0.26 w/o after heating to 600° C. at 10° C./min in flowing nitrogen; Ester Wax E, about 0.5 w/o. This resiual carbon is totally removed after burnout in air. The decomposition ranges and residues may be accurately measured by thermogravimetric analysis of the ester wax. For a die size of less than about 0.4 mm, a trace amount of oleic acid of no more than about 1.0 weight percent may be added to the ester wax of the binder to facilitate extrusion through the capillary die. However, for larger die sizes, the ester wax alone is sufficient.

Figure 3:
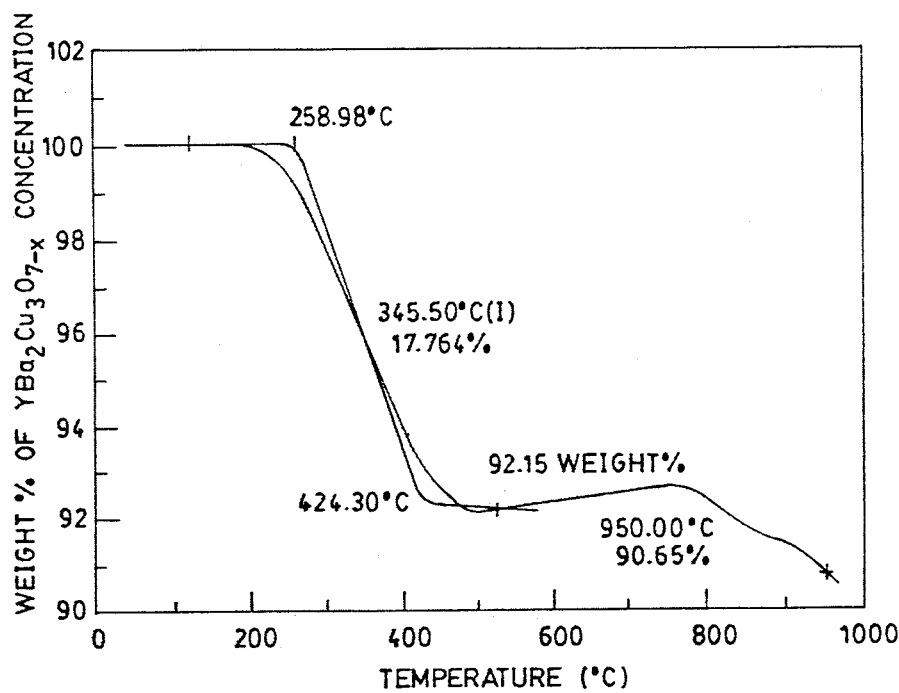
FIG. 3 is a graphical representation of the results of a thermogravimetric analysis of an yttrium barium copper oxide powder-binder mixture in accordance with yet another embodiment of the invention, indicating a high powder concentration in the binder.

The superconducting powder is dispersed in the ester wax binder at a solids loading of at least about 90 w/o, typically about 90-92 w/o, to form an extrudable powder/binder mixture. For Y—B—C—O this is a solids loading of about 58.5-65 v/o (volume percent) based on its theoretical density of about 6.38 g/ml; for bismuth containing copper oxides, about 58 v/o based on a theoretical density of about 6.5 g/ml. A typically high powder concentration in an yttrium barium copper oxide powder-binder mixture, as determined by thermogravimetric analysis (TGA), is shown in FIG. 3. FIG. 3 shows decomposition of the binder beginning at about 150° C. and being completed at about 550° C. The solids remaining on completion of this binder decomposition process (at about 550° C.) is about 92 w/o of the starting mixture.

The described ester waxes contribute several valuable properties to the extrudable mixture. For example, the polar nature of, e.g., the Y—B—C—O superconducting compound can result in problems in dispersing the powder in a binder. The described ester wax serves to disperse the powder by weak electrostatic force. The carbonyl group (C=O) linking the ester's long hydrocarbon side chains (R and R') is responsible for the binding of the wax to surface oxygen atoms of the superconducting oxides through the formation of hydrogen bonds, as shown in the following:

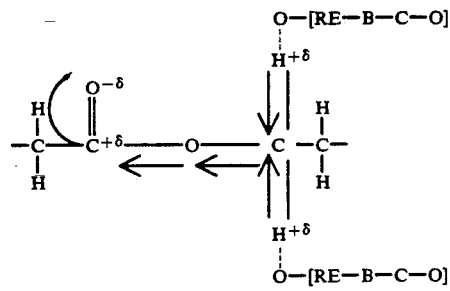

Therefore, better dispersibility results. The long hydrocarbon chains also act as lubricants, leading to higher packing densities of the powder. Also, the low carbon residue after binder removal prevents the lowering of the critical current density that can occur in the superconducting wire product when incomplete binder removal results in a high level of residual impurities.

The ester waxes also exhibit advantageous physical properties. The selected soft wax binders cause far less microstructural cracking during binder burnout than, e.g., prior art hard paraffin wax binders. Such cracking seriously detracts from the critical current density achievable in the superconducting wire product, as further discussed below. As described above, the melting points of these ester waxes are in the range of about 77°-83° C., the viscosities are about 94 centipoise, and the densities are about 0.95-1.03 g/ml.

Because of their superior properties, generally no additional plasticizer, dispersant, or solvent is needed for mixing. For example, a small batch (5 to 40 grams) of powder can be easily mixed with the binder wax in a beaker with a stirrer on a hot plate. Alternatively, a commercially available compounder, e.g. a Haake compounder with a sigma blade, may be used for a larger batch, e.g. above about 100 grams. Typically, the ester wax is heated before or during mixing to melt the wax. Alternatively, heat created by friction during the mixing process itself may be sufficient to melt the wax. Melting of the wax is generally advisable because of the high powder concentration in the mixtures. In some situations, e.g. when using an extruder die less than about 0.4 mm in diameter, additions to the binder system of small amounts of dispersants or surfactants may be desirable to maximize the solids loading possible. For example, as little as about 0.15 gram of oleic acid in a sample containing about 10 grams of powder will permit a sample of at least 90 w/o solids loading to be readily extruded using such small dies.

The mixing and extrusion of this powder/binder mixture may be performed using laboratory equipment or commercially available apparatus. For example, samples above about 100 grams have been processed in a Rheomix Model 400 or 600 mixer available from Fisons Instrument (Valencia, Calif.), which can also serve as an extruder for shaping the mixture to form a wire. Smaller samples, e.g. about 10-40 grams, have been extruded using a pneumatically pumped syringe held in an alumina heating oven, the syringe having 0.15-3.0 mm capillary dies. These extrusion systems are only presented as examples; other extrusion or drawing systems may be used, and other heating means may be utilized, if needed. Wires with diameters of 0.15-2.0 mm and tapes with widths of up to 3 mm have been extruded using the above-described apparatus. An adjustable pressure of about 10-90 psi is typically applied for extrusion.

Alternatively, a wire (fiber) may be drawn or spun from the mixture by known means, e.g. by drawing using a glass rod or by extruding from a rotating spindle. In a typical laboratory scale process, the ester wax is melted in a beaker, e.g. at 100° C. The superconducting Y—B—C—O powder is then slowly added into the molten wax and is stirred constantly to ensure homogeneous mixing. Fibers with an average diameter of 60 $\mu$m to 200 $\mu$m, at least 12 inches in length have been drawn from the powder/binder mixture using a glass rod.

Larger wires or fibers may be produced using other extruding or drawing methods and apparatus. As mentioned above, if the size of the extruder die is less than about 0.4 mm, a trace of oleic acid may be added to the mixture to facilitate extrusion through the capillary die. If desired, the binder-containing wire or fiber may be shaped into a coil after extrusion or drawing and before binder removal. The soft wax binder facilitates such shaping without the micro- and macro-scale cracking found using, e.g., prior art paraffin binders.

Figure 4:
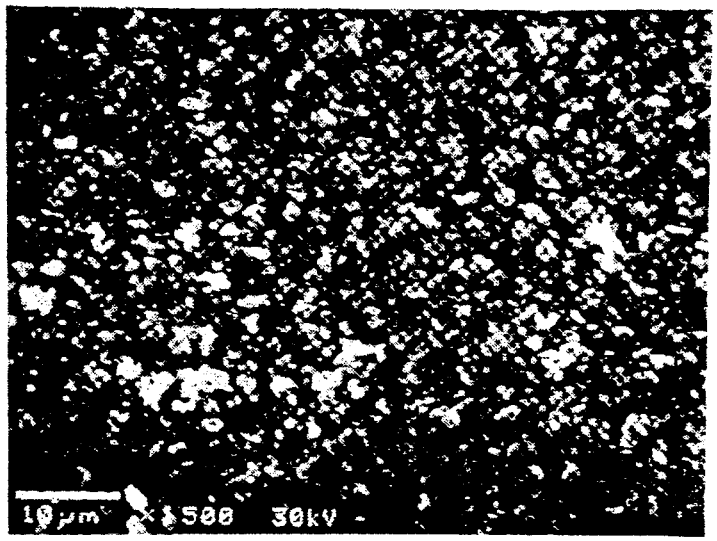
FIG. 4 is a photomicrograph of an extruded wire of a typical superconducting powder/ester wax binder mixture, prepared in accordance with still another embodiment of the invention, showing the microstructural homogeneity of the distribution of the powder in the binder.
Figure 5:
FIG. 5 is a photomicrograph of a prior art melt-spun wire containing the same yttrium barium copper oxide powder as the wire of FIG. 4 but dispersed in a paraffin binder at a lower solids loading.

The concentration of powders in the wax (solids loading) and the homogeneity of the mixing may be characterized by thermogravimetric analysis (TGA), as shown in FIG. 3. In order to have an accurate measurement, the solids loading in the extruded powder/binder mixture may be calculated based on the weight loss of several samples taken randomly from the mixture. For example, the average percent of powder in a mixture of 9.24 grams of powder and 0.76 grams of ester wax was 92.0-93.0 w/o with a standard deviation of less than 0.5%. The dispersibility of the powder in the binder matrix may be examined by scanning electron microscope (SEM). FIG. 4 is a SEM photomicrograph of an as-extruded wire of a typical Y—B—C—O superconducting powder/ester wax binder mixture, prepared as described above. FIG. 4 illustrates the homogeneity of the distribution of powder in the binder. FIG. 5 is a photomicrograph of a prior art wire melt spun from the same powder as the wire of FIG. 4, but using a paraffin wax-based binder system. The solids loading in this prior art wire is maximized at about 45 v/o. Also, the microstructure may be seen in FIG. 5 to be unhomogeneous.

The binder is removed from the shaped wires, then the green wires are sintered and textured according the carefully controlled heating/cooling schedule described in detail below. As used herein, the term "green" is intended to indicate a wire, tape, fiber, etc. in the binder-removed, unsintered state; that is of sufficient firmness after binder removal to maintain its shape during subsequent handling and sintering. It was found that the higher the powder concentration in the extruded wire, the higher the green density of the wire after binder removal and the higher the sintered density of the wire. This high final density means a low porosity in the superconducting wire, which has been found to increase the critical current density of the wire.

The heat treatment typically involves four steps, which may conveniently be carried out in a continuous heating/cooling process in an oxidizing atmosphere. The organic binder is removed from the wire in a first step, e.g. at about 500°-600° C., to form a green wire. The green wire then is sintered, e.g. below about 980° C. to consolidate or densify its microstructure and eliminate porosity. The consolidated wire is textured, e.g. by heating above about 980° C., to align the grains along the current carrying plane and improve the critical current density of the final wire product. Alternatively, the wires may be textured by seeding the mixture with textured superconducting grains before extruding, binder removal, and sintering. This texturing method is described in more detail below. By either of these texturing methods, sintered wires are produced having elongated grains aligned along the fiber axis. The textured wire is then annealed in oxygen at about 450°-550° C., transforming the material, e.g. tetragonal RE—B—C—O phase, to the superconducting phase, e.g. the orthorhombic phase. The binder removal, sintering, and texturing steps may be carried out in air or oxygen; the annealing step preferably in oxygen. Optionally, the heating process may be interrupted after the binder removal step, and/or after the sintering step. That is, at either or both of these points the wire may be cooled to room temperature in the oxidizing atmosphere then reheated to the required temperature to perform the next processing step.

Figure 6:
FIG. 6 is a photomicrograph of the wire of FIG. 4 after binder removal at a slow heating rate, showing a homogeneous, porous microstructure without cracks.

In a typical heating process, the wire is buried in or set on the top of superconducting powder of the same composition to prevent contamination, e.g. a Y—B—C—O wire may be set on a superconducting Y—B—C—O powder held in an alumina boat. A typical heating rate for micron-size fibers is about 120° C./hr to the binder-removal temperature, typically about 550° C., with the sample being held at this temperature for ½-1 hr to completely remove the organic binder from the fiber. For wires larger than about 1.5 mm in diameter a slower heating rate, e.g. 60° C./hr, is preferred for binder removal to prevent internal cracking. FIG. 6 is a SEM photomicrograph of the wire of FIG. 4 after binder removal at this slower heating rate, showing a uniform, porous microstructure without cracks. The temperature may then be increased to, e.g., about 950° C. at a heating rate of, e.g., about 120° C./hr to consolidate the particles by a sintering process. A holding time of about ½ hr at 950° C. will typically densify even wires of greater than 250 μm diameter. Wires sintered at 850° C. and 910° C. are generally less dense, as indicated by SEM examination of their microstructures, than those sintered at 950° C.

Figure 7:
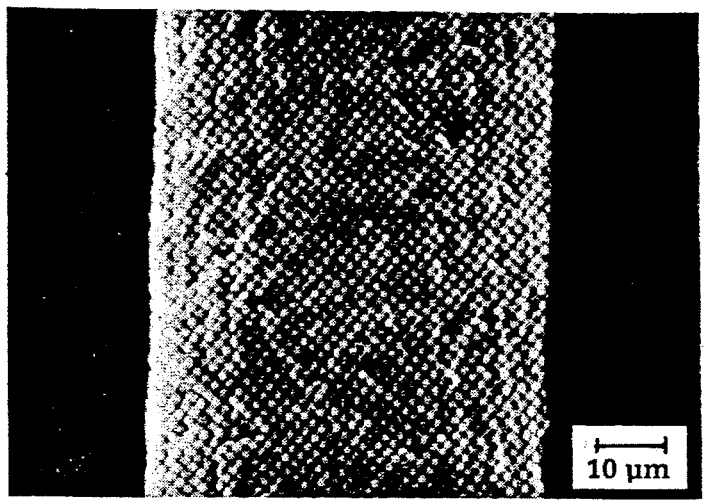
FIG. 7 is a photomicrograph of the as-sintered surface of the wire of FIG. 6 after sintering, showing surface smoothness and a fully dense microstructure with some degree of grain alignment along the wire axis due to the extrusion process.
Figure 8:
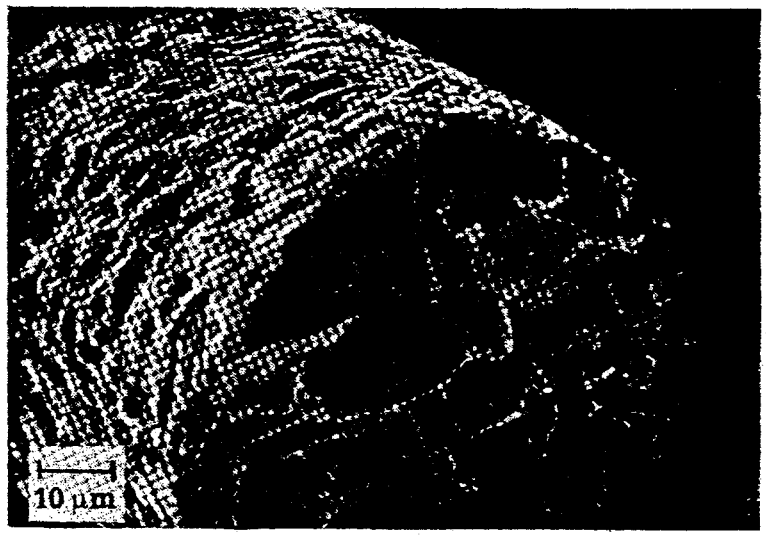
FIG. 8 is a photomicrograph of a cross section of the sintered wire of FIG. 7, indicating no processing defects.
Figure 9:
FIG. 9 is a photomicrograph of a cross section of a wire formed using the same paraffin binder as that of the wire of FIG. 5, after binder-removal and sintering, showing microstructural cracking.

As a result of the high shear stresses induced during the extrusion or drawing process, some degree of alignment of elongated grains is evident in the surface of the sintered wire before texturing. This effect does not appear to be dependent on the shape of the powder grains in the starting formulation. However, the platelet-shaped powders prepared via the nitrate precursor route appear to result in denser microstructures than the solid state processed powders. Smaller grain sizes, below about 2.5 μm, are preferred for larger diameter (about 250 μm and larger) wires, since the sintering temperature necessary to achieve full density in these thicker wires is somewhat lower for the smaller particle sizes. For wires below about 250 μm in diameter the particle size does not appear to have as great an effect. The microstructure of a typical fully dense sintered product is shown in FIG. 7, which is a photomicrograph of the as-sintered surface of the wire of FIG. 6 after sintering. FIG. 7 shows surface smoothness and a fully dense microstructure with some degree of grain alignment along the wire axis due to the extrusion process. FIG. 8 is a photomicrograph of a cross section of the sintered wire of FIG. 7, indicating no processing defects. FIG. 9 shows a prior art wire similar to that shown in FIG. 5, after burnout (removal) of the paraffin wax-based binder and sintering in a manner similar to that described herein. As shown in FIG. 9, the inhomogeneity of the powder-binder mixture has resulted in microstructural cracking in the wire shaped using a prior art binder system.

Even without a specific texturing step, the binder system and resulting high solids loading and high sintered density improves the critical current density of the wire. The following sintering schedule was carried out for several wire samples: The binder-removed wire was heated to about 950° C. using about a 120° C./hr heating rate and sintered at that temperature for at least ½ hr. The wire was cooled to about 500° C. at a rate of about 120° C./hr and held at this temperature for at least 10 hr in flowing oxygen. Wires exhibiting about 99% or more of theoretical density may need up to about 48 hr at this temperature for annealing. The annealing time is dependent on the oxygen permeability of the sample, with denser and larger diameter wires requiring longer annealing in oxygen to maximize the formation of the superconducting phase. One extruded wire sample 260 μm in diameter processed by this sintering schedule exhibited a critical current density of 1520 A/cm$^2$ at 77 K in the earth's magnetic field. Similarly, one drawn fiber of 100 μm diameter processed by this sintering schedule showed a critical current density of 1000 A/cm$^2$ at 77 K in the earth's magnetic field.

As mentioned above, two methods may be used to align the grains along the fiber axis to further improve the critical current density. In the first of these methods, the binder-removed wire is heated to the incongruent melting temperature (about 1010° C. for $YBa_2Cu_3O_{7-x}$) and held at that temperature for a brief period (e.g. about 1-10 minutes) followed by slow cooling. The brief period at the incongruent melting temperature begins the formation of a partial melt phase within the material to facilitate grain growth and texturing in the material. In a typical slow-cooling process, the material containing this small amount of at least one melt phase is cooled at a 60° C./hr rate to about 980° C., held for a short time, e.g. 10 minutes, to begin to recrystallize and densify the material, and cooled at a more rapid rate, e.g. about 120° C./hr, to 950° C. and held for a longer time, e.g. about 1-2 hr, to allow slow recrystallization of the melted material to continue forming elongated aligned grains within the wire.

Figure 10:
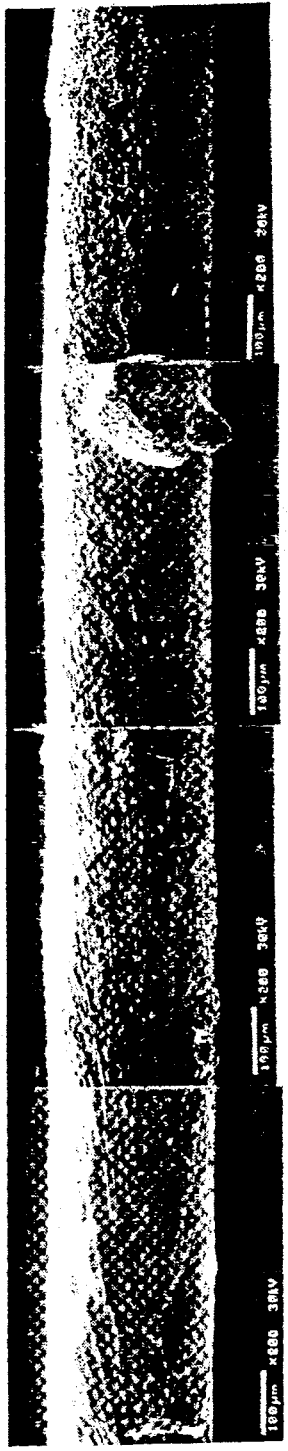
FIG. 10 is a composite of a series of photomicrographs of the surface of the wire of FIG. 8 after texturing by heating to the incongruent melting temperature, showing a high degree of grain alignment along the wire axis and elongated grains about 2 mm in length.
Figure 11:
FIG. 11 is a photomicrograph of a fractured cross section of the sintered wire of FIG. 9, indicating platelet growth throughout the entire cross-section.

This texturing step is followed by annealing of the fully dense textured wire in oxygen. Typically, the wire is cooled to about 500° C. for at least 10 hr, as described above, to convert the crystals to the superconducting phase. FIG. 10 is a composite of a series of photomicrographs of the surface of the wire of FIG. 8 after texturing by heating to the incongruent melting temperature followed by the above-described slow cooling and annealing. FIG. 10 shows a high degree of grain alignment along the wire axis and elongated grains about 2 mm in length. FIG. 11 is a photomicrograph of a fractured cross section of the grain-aligned wire of FIG. 10, indicating platelet-type growth throughout the entire cross-section. Similar sintering/texturing schedules with holding periods of at least 24 hr achieved grain alignment in a Y—B—C—O bulk material in which grains of 0.4–0.6 mm in length were achieved over a wide area of 2.5 mm. The incongruent melting temperatures of other RE—B—C—O materials are available in the technical literature (See, for example, T. Aselage et al., *J. Mat. Res.* 3 [6], Nov/Dec 1988, pp. 1279-91.) or may be readily determined using known thermogravimetric analysis techniques.

In an alternate texturing method, the superconducting powder may be seeded—before or during mixing with the binder—with a small amount, e.g. as little as 3-5 w/o, of highly aligned superconducting clusters of like material (e.g. superconducting Y—B—C—O powder may be seeded with superconducting highly aligned clusters of Y—B—C—O material), followed by extrusion and consolidation steps. Production and incorporation of such seeding clusters are described in detail in application Ser. No. 07/745,819, referenced above.

The aligned clusters are typically micro-sized, e.g. below 210 μm in diameter. Such aligned clusters may be obtained, for example, by cold pressing pellets of superconducting powder; rapidly heating the pellets (e.g. at 5° C./min) to 1010° C. in air; cooling at 0.02°-0.5° C./min to 980° C. and at 2° C./min to 950° C.; holding at 950° C. for at least 10 hr for texturing; and annealing at 500° C. in flowing oxygen for 24-36 hr. The largest aligned grains of such aligned pellet samples are 0.4-0.6 mm diameter and are randomly distributed throughout over 70% of the pellet, the largest aligned area being about 2.5 mm in width. The pellets are then crushed and screened to obtain clusters of the desired size.

By seeding the wire with such highly oriented clusters, alignment of the grains in wires otherwise prepared, extruded, and sintered as described above may be accomplished without an extended hold at the high temperatures described for the unseeded samples. It would appear that the high shear stresses induced during the extrusion or drawing process provide uniformity of alignment direction of the aligned clusters along the wire axis to permit the grain-alignment process to occur during holding at lower temperatures. Also, since the seeding initiates alignment of grains throughout the length of the sample, the degree of alignment is not influenced by the sample length. A typical sintering schedule for binder-removed, seeded samples of Y—B—C—O wires is (1) heating at about 5° C./min to 1010° C. and holding at that temperature for 1 min; (2) cooling at 0.04° C./min to 950° C. and holding at that temperature for ½ hr; (3) cooling at about 2° C./min to 500° C. and holding at that temperature for at least 24 hr; and (4) cooling at about 2° C./min to ambient; all in an oxidizing atmosphere.

Known sintered superconducting wires and fibers are very brittle and hard to handle, particularly those of diameters less than 200 μm. In an alternate process, the ductility and workability of RE—B—C—O wires produced may be improved by the addition of silver powder to the superconducting powder or to the powder/binder mixture. Silver is unreactive with $YBa_2Cu_3O_{7-x}$ and the other $REBa_2Cu_3O_{7-x}$ materials, and has a high diffusivity for oxygen and a low melting point, 962° C. Also, silver can function as a sintering aid to enhance coupling between superconducting grains. By incorporating about 3-12 w/o, typically about 5-10 w/o, based on the total weight of powder in the mixture, of silver powder (e.g. average particle size of 2.0-3.5 μm) into the wire matrix, the mechanical properties of the sintered wire may be greatly improved. Alternatively, silver oxide (AgO or $Ag_2O$) may be added to the powder/binder mixture to provide the silver component.

Typically, the silver or silver oxide is incorporated into the RE—B—C—O powder by dry ball milling for about 10 minutes. The mixture is then dispersed into the ester wax binder. Optionally, trace amounts of oleic acid or other additives may be added as described above to facilitate the extrusion process. The combined solids concentration, i.e. the mixture of RE—B—C—O plus silver or silver oxide, in the binder is typically about 89.0-90.0 w/o, as compared to a typical concentration of about 92.0 w/o without silver. The critical current density of one Y—B—C—O/Ag wire sample sintered at 950° C. for ½ hr was 1300 $A/cm^2$; the critical temperature of the wire was 92.5 K.

The following examples are presented to enable those skilled in the art to more clearly understand and practice the present invention. These examples should not be considered as a limitation upon the scope of the present invention, but merely as being illustrative and representative thereof.

EXAMPLES

Y—B—C—O powders were mixed with melted Ester Wax RT binder at the melting points of the binders, 77°-85° C. A trace of oleic acid was added to the samples containing silver of silver oxide and to those containing seeding clusters. The relative amounts of components in the powder/binder mixture are shown in Table I.

A pneumatic extrusion system including a syringe, an alumina heater, and a pneumatic pump was used to shape the wires. After evacuation of the extruder to remove trapped air, wires and helical coils of greater than 100 cm length were extruded through capillary dies of various diameters between 70 μm and 2 mm, as shown in Table 1.

The wires underwent binder removal and sintering in air, followed by annealing in oxygen, as shown in Table II. The transport critical current densities of the wires were measured, using a criterion of 1 μV/cm, at liquid nitrogen temperature at the earth's magnetic field. Silver contacts were evaporated onto the surface of the samples in a four point configuration with a 4 mm interval. Gold wires used as leads were attached to the contacts using silver paste. The critical temperatures ($T_c$ at dc zero resistance) and critical current densities ($J_c$) of the wires are shown in Table II.

TABLE I

| Sample Group | Components, w/o | | | | | Wire Diam, μm |
|---|---|---|---|---|---|---|
| | Y—B—C—O | Ag | Aligned Clusters | Ester Wax RT | Oleic Acid, ml/10 g Sample | |
| A | 91 | — | — | 9 | — | 100-250 |
| B | 91 | — | — | 9 | — | 250-600 |
| C | 91 | — | — | 9 | — | 600 |
| D | 85-85.5 | 5 | — | 9.5-10 | 0.15 | 600 |
| E | 85-85.5 | 5 | — | 9.5-10 | 0.15 | 600 |
| F | 85-88 | — | 2-5 | 9.5-10 | 0.15 | 600 |

TABLE II

| Smpl Grp | Binder Removal | | | Sinter/Texture | | | Anneal in O2 | | | | Tc K | Jc A/cm² |
|---|---|---|---|---|---|---|---|---|---|---|---|---|
| | Heating °C./hr | to T °C. | Hold min | Htg/Cool °C./hr | to T °C. | Hold min | Cool °C./hr | to T °C. | Hold hr | Cool to Amb, °C./hr | | |
| A | 60 | 550 | 60 | 120 | 920 | 30 | 120 | 500 | 10 | 120 | (see Sample B) | |
| B | 30 | 550 | 120 | 120 | 950 | 60 | 120 | 500 | 24 | 120 | (A, B combined) 90 | 1000* |
| C | 30 | 550 | 60 | 600 | 1010 | 6 | 120 | 500 | 24 | 120 | 90 | ** |
| | | | | 12 | 950 | 30 | (in flowing O2) | | | | | |
| D | 30 | 550 | 120 | 120 | 965 | 60 | 120 | 500 | 24 | 120 | 91.5-92 | 1200 |
| E | 30 | 550 | 120 | 600 | 1020 | 6 | 120 | 500 | 10 | 180 | 91.5-92 | 4000+ |
| | | | | 120 | 950 | 60 | (in flowing O2) | | | (to 50° C.) | | |

TABLE II-continued

| Smpl Grp | Binder Removal | | | Sinter/Texture | | | Anneal in O2 | | | | Tc K | Jc A/cm² |
|---|---|---|---|---|---|---|---|---|---|---|---|---|
| | Heating °C./hr | to T °C. | Hold min | Htg/Cool °C./hr | to T °C. | Hold min | Cool °C./hr | to T °C. | Hold hr | Cool to Amb. °C./hr | | |
| F | 120 | 550 | 60 | 600 | 1010 | 6 | 120 | 500 | 24 | 120 | 90 | 1000 |
| | | | | 12 | 950 | 120 | | | | | | |

*Best samples, Jc = 1500 A/cm²
**Not measured
+ By dc measurement; by magnetization, Jc = 10⁴ A/cm²

The process described herein achieves highly aligned superconducting rare earth barium copper oxide or bismuth-containing copper oxide wires, tapes, fibers, and the like exhibiting dense, homogeneous microstructures and smooth surfaces. Thus microstructural defects are reduced and mechanical and electrical properties, particularly the critical current densities, $J_c$, are enhanced.

While there have been shown and described what are at present considered the preferred aspects of the invention, it will be obvious to those skilled in the art that various changes and modifications can be made therein without departing from the scope of the invention as defined by the appended claims.

I claim:

1. A method for producing a superconducting copper oxide based wire exhibiting improved critical current density comprising the steps of:
    mixing a copper oxide based superconductor as a powder and a binder as a melt at a solids loading of at least about 90% by weight to form a homogeneous extrudable powder/binder mixture, wherein said binder consists essentially of an ester wax with no more than about 0.25 weight percent extrusion-aiding additives, and said ester wax has the general formula RCOOR' with said R and said R' each being independently selected from the group consisting of long chain hydrocarbon groups of at least 6 carbons, and said ester wax has a melting point of about 40°–100° C. and a viscosity of about 94–2000 centipoise at its melting point;
    shaping said binder/powder mixture to form a shaped wire;
    heating said shaped wire in an oxidizing atmosphere at a heating rate of up to about 120° C./hr to a binder removal temperature of about 500°–600° C., and holding said wire in said oxidizing atmosphere at said binder removal temperature for a time sufficient to remove said binder from said wire and to form a green wire having a density of at least 50% of theoretical density;
    heating said green wire in said oxidizing atmosphere at a heating rate of about 50°–130° C./hr to about the incongruent melting temperature of said superconductor, and holding said green wire in said oxidizing atmosphere at said incongruent melting temperature for a time just sufficient to begin partial melting of at least one component in said superconductor; and
    cooling said partially melted wire in said oxidizing atmosphere at a rate below about 130° C./hr to a consolidation temperature of about 940°–969° C., and holding said wire in said oxidizing atmosphere at said consolidation temperature for a time sufficient to consolidate said wire to a density of at least 90% of theoretical density and sufficient to achieve an average grain length of at least about 0.3 mm and grain alignment along the length of said wire;
    cooling said consolidated wire in said oxidizing atmosphere at a rate below about 130° C./hr to a cooled temperature at or below about 550° C.; and
    holding said cooled wire at an annealing temperature of about 450°–550° C. in an atmosphere of flowing oxygen for a time sufficient to convert the crystal structure of said wire to at least 50 v/o superconducting perovskite crystal.

2. A method in accordance with claim 1 wherein said mixture further comprises at least about 3 w/o grain-aligned clusters of a like copper oxide based superconductor.

3. A method in accordance with claim 1 wherein said copper oxide based superconductor is a bismuth containing copper oxide superconductor.

4. A method in accordance with claim 3 wherein said bismuth containing copper oxide superconductor is selected from the group consisting of a bismuth strontium calcium copper oxide superconductor and a bismuth lead strontium calcium copper oxide superconductor.

5. A method in accordance with claim 1 wherein said copper oxide based superconductor is a rare earth barium copper oxide superconductor.

6. A method in accordance with claim 5 wherein said rare earth copper oxide superconductor is an yttrium barium copper oxide superconductor and said incongruent melting temperature is about 980–1050° C.

7. A method in accordance with claim 1 wherein said wire rests on a setter powder comprising a like copper oxide based material throughout said heating and cooling steps.

8. A method for producing a superconducting rare earth barium copper oxide based wire exhibiting improved critical current density comprising the steps of:
    mixing a rare earth barium copper oxide based superconductor as a powder, silver or silver oxide as a powder in an amount of about 3–12 w/o of the total powder weight, and a binder as a melt at a solids loading of at least about 89% by weight to form a homogeneous extrudable powder/binder mixture, wherein said binder consists essentially of an ester wax with no more than about 0.25 weight percent extrusion-aiding additives, and said ester wax has the general formula RCOOR' with said R and said R' each being independently selected from the group consisting of long chain hydrocarbon groups of at least 6 carbons, and said ester wax has a melting point of about 40°–100° C. and a viscosity of about 94–2000 centipoise at its melting point;
    shaping said binder/powder mixture to form a shaped wire;
    heating said shaped wire in an oxidizing atmosphere at a heating rate of up to about 120° C./hr to a binder removal temperature of about 500°–600 ° C., and holding said wire in said oxidizing atmosphere at said binder removal temperature for a time sufficient to remove said binder from said wire and to form a green wire having a density of at least 50% of theoretical density;

heating said green wire in said oxidizing atmosphere at a heating rate of about 50°-130° C./hr to about the incongruent melting temperature of said superconductor, and holding said green wire in said oxidizing atmosphere at said incongruent melting temperature for a time just sufficient to begin partial melting of at least one component in said superconductor; and cooling said partially melted wire in said oxidizing atmosphere at a rate below about 130° C./hr to a consolidation temperature of about 940°-969° C., and holding said wire in said oxidizing atmosphere at said consolidation temperature for a time sufficient to consolidate said wire to a density of at least 90% of theoretical density and sufficient to achieve an average grain length of at least about 0.3 mm and grain alignment along the length of said wire;

cooling said consolidated wire in said oxidizing atmosphere at a rate below about 130° C./hr to a cooled temperature at or below about 550° C.; and holding said cooled wire at an annealing temperature of about 450°-550° C. in an atmosphere of flowing oxygen for a time sufficient to convert the crystal structure of said wire to at least 50 v/o superconducting perovskite crystal.

9. A method in accordance with claim 8 wherein said wire rests on a setter powder comprising a like copper oxide based material throughout said heating and cooling steps.

* * * * *